United States Patent
Cheng et al.

(10) Patent No.: US 9,640,400 B1
(45) Date of Patent: May 2, 2017

(54) CONFORMAL DOPING IN 3D SI STRUCTURE USING CONFORMAL DOPANT DEPOSITION

(71) Applicant: Applied Materials, Inc., Santa Clara, CA (US)

(72) Inventors: Rui Cheng, Santa Clara, CA (US); Abhijit Basu Mallick, Fremont, CA (US); Srinivas Gandikota, Santa Clara, CA (US); Pramit Manna, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/961,920

(22) Filed: Dec. 8, 2015

Related U.S. Application Data

(60) Provisional application No. 62/242,146, filed on Oct. 15, 2015.

(51) Int. Cl.
| | |
|---|---|
| H01L 21/336 | (2006.01) |
| H01L 21/225 | (2006.01) |
| H01L 29/66 | (2006.01) |
| H01L 21/324 | (2006.01) |
| H01L 21/02 | (2006.01) |
| H01L 29/167 | (2006.01) |

(52) U.S. Cl.
CPC .... *H01L 21/2254* (2013.01); *H01L 21/02271* (2013.01); *H01L 21/02274* (2013.01); *H01L 21/324* (2013.01); *H01L 29/167* (2013.01); *H01L 29/66795* (2013.01)

(58) Field of Classification Search
CPC ........... H01L 21/2254; H01L 29/66795; H01L 21/02271; H01L 29/167; H01L 21/02274; H01L 21/324; H01L 438/283; H01L 29/66484; H01L 438/288; H01L 2029/7858; H01L 21/28282; H01L 21/823431; H01L 21/823821; H01L 21/845
See application file for complete search history.

(56) References Cited

U.S. PATENT DOCUMENTS

| | | |
|---|---|---|
| 8,114,761 B2 | 2/2012 | Mandrekar et al. |
| 8,580,664 B2 | 11/2013 | Clark |
| 2008/0132047 A1 | 6/2008 | Dunne et al. |
| 2012/0252197 A1* | 10/2012 | Clark ................. H01L 21/2254 438/559 |

(Continued)

FOREIGN PATENT DOCUMENTS

| | | |
|---|---|---|
| JP | 03-163821 A | 7/1991 |
| WO | 2014-120392 A1 | 8/2014 |

OTHER PUBLICATIONS

International Search Report and Written Opinion of related application PCT/US2016/048950 dated Nov. 20, 2016.

*Primary Examiner* — Julio J Maldonado
*Assistant Examiner* — Stanetta Isaac
(74) *Attorney, Agent, or Firm* — Patterson + Sheridan, LLP

(57) ABSTRACT

Embodiments described herein generally relate to doping of three dimensional (3D) structures on a substrate. In one embodiment, a conformal dopant containing film may be deposited over the 3D structures. Suitable dopants that may be incorporated in the film may include boron, phosphorous, and other suitable dopants. The film may be subsequently annealed to diffuse the dopants into the 3D structures.

17 Claims, 2 Drawing Sheets

(56) References Cited

U.S. PATENT DOCUMENTS

| | | |
|---|---|---|
| 2013/0052801 A1 | 2/2013 | Berliner et al. |
| 2014/0004689 A1 | 1/2014 | Nainani et al. |
| 2015/0079733 A1 | 3/2015 | Oganesian et al. |
| 2015/0104955 A1* | 4/2015 | Pore .................... H01L 21/0217 438/791 |

* cited by examiner

CONFORMAL DOPING IN 3D SI STRUCTURE USING CONFORMAL DOPANT DEPOSITION

CROSS-REFERENCE TO RELATED APPLICATIONS

This application claims benefit to U.S. Provisional Patent Application No. 62/242,146, filed Oct. 15, 2015, the entirety of which is herein incorporated by reference.

BACKGROUND

Field

Embodiments described herein generally relate to doping of three dimensional (3D) structures formed on a substrate. More specifically, embodiments described herein relate to conformal doping in 3D silicon structures using conformal dopant deposition processes.

Description of the Related Art

Three dimensional (3D) transistors, such as fin field-effect transistors (FinFETs) are promising candidates to extend complimentary metal-oxide semiconductor (CMOS) scaling. Such FinFET transistors generally provide for improved electrostatic control (i.e. short channel effects) and lower sensitivity to random dopant fluctuations. However, implementation challenges and process complexity issues exist in the integration of FinFETs at advanced technology dimensions.

For example, one challenge of FinFET integration is dopant concentration in 3D silicon containing device structures. As a result of the lack of a body or back gate bias in fully depleted (i.e. no mobile carriers) FinFET device structures, complicated workfunction engineering is often necessary to achieve workable threshold voltages for undoped FinFETs. In addition to threshold voltage complications, dopant concentration and dopant distribution within the FinFET structures present additional challenges in 3D device structure manufacturing processes.

Current FinFET doping processes utilize angled ion implantation schemes or line of sigh deposition schemes. In angled ion implantation schemes, dopant concentration and distribution specificity is difficult to control and such systems are expensive to implement in processing sequences. Additionally, throughput may be negatively affected with additional apparatus used to perform doping operations. Line of sight schemes may be used to deposit dopant films on FinFETs, but the 3D structure of FinFETs prevent suitable film deposition characteristics (i.e. deposition on sidewalls of 3D structures) which adversely affects dopant distribution and concentration within the FinFET structures.

Accordingly, there is a need in the art for improved FinFET doping methods.

SUMMARY

In one embodiment, a substrate processing method is provided. The method includes depositing a conformal boron-carbon-nitrogen containing film on a three dimensional structure formed on a substrate. The three dimensional structure may be a FinFET device and the three dimensional structure and the film may be annealed to diffuse the boron into the three dimensional structure to dope the FinFET device.

In another embodiment, a substrate processing method is provided. The substrate processing method includes forming silicon containing three dimensional structures of a substrate and exposing the three dimensional structures to one or more dopant containing precursors and one or more carrier gases. A conformal film may be deposited on the three dimensional structures and the conformal film may include a dopant and at least one non-dopant material selected from the group consisting of carbon and nitrogen. The three dimensional structures and the conformal film may be annealed to diffuse the dopant from the conformal film into the three dimensional structures.

In yet another embodiment, a substrate processing method is provided. The method includes positioning a substrate having three dimensional structures formed thereon in a processing region of a film deposition chamber and exposing the three dimensional structures to one or more dopant containing precursors and one or more carrier gases. A conformal film may be deposited on the three dimensional structures and the conformal film may include a dopant and at least one non-dopant material selected from the group consisting of carbon and nitrogen. The substrate may be transferred to a thermal processing chamber and the three dimensional structures and the conformal film may be annealed to diffuse the dopant from the conformal film into the three dimensional structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, common words have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to doping of three dimensional (3D) structures on a substrate. In one embodiment, a conformal dopant containing film may be deposited over the 3D structures. Suitable dopants that may be incorporated in the film may include boron, phosphorous, and other suitable dopants. The film may be subsequently annealed to diffuse the dopants into the 3D structures.

Figure 1:
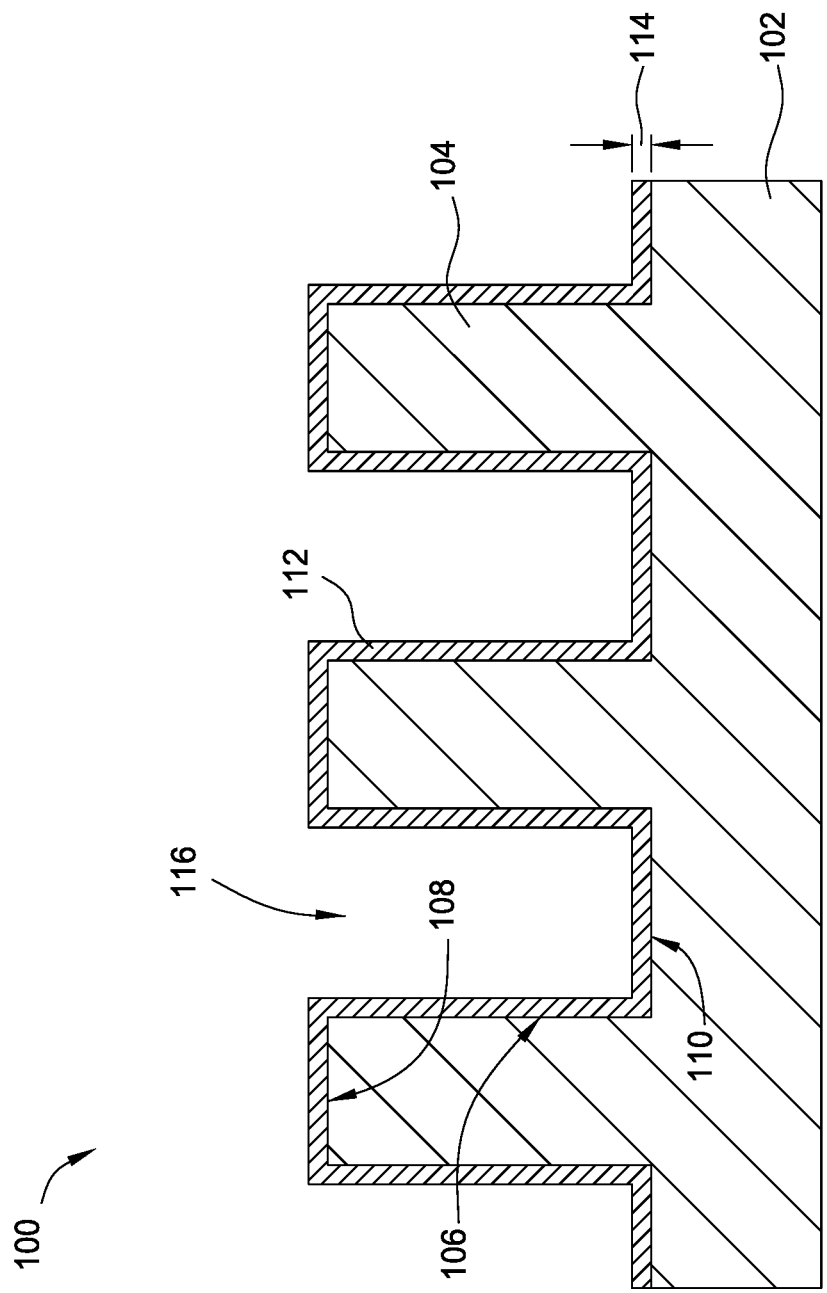
FIG. 1 illustrates a schematic, cross-sectional view of a substrate having three dimensional (3D) structures formed thereon according to one embodiment described herein.

FIG. 1 illustrates a schematic, cross-sectional view of a substrate 100 having three dimensional (3D) structures 104 formed thereon according to one embodiment described herein. The substrate 100 includes the 3D structures 104 which extend from a base material layer 102. In one embodiment, the base material layer 102 may be silicon containing material, such as pure silicon or doped silicon. In another embodiment the base material layer 102 may be an insulator material, such as oxides, nitrides, or the like. For example, the substrate 100 may be a silicon-on-insulator substrate. The embodiments described herein are generally made with reference to a 300 mm circular substrate, however, it is contemplated that various other substrate dimensions may benefit from the embodiments described herein.

The 3D structures 104 may be formed on the base material layer 102 by various patterning and etching processes. Generally, the 3D structures are formed with dimensions suitable for implementation as fin field-effect transistors (FinFETs) in complimentary metal-oxide semiconductor (CMOS) transistors, however, other transistor types may also benefit from the embodiments described herein. It is contemplated that the 3D structures may be suitable for and may have dimensions commensurate for utilization in current technology nodes and advanced technology nodes, such as a sub-10 nm node.

The 3D structures 104 may be the same material as the base material layer 102 or a material different from the base material layer 102. In one embodiment, the 3D structures 104 may be formed from silicon. In other embodiments, the 3D structures may include multiple materials, such as silicon and one or more dopants. The 3D structures 104 extend from the base material layer 102 and are spaced apart by trenches 116. The 3D structures include a top surface 108 and sidewalls 106 which extend between the top surface 108 and a bottom surface 110 of the trenches 116.

A conformal film 112 is deposited over the 3D structures 104 and the base material layer 102. The conformal film 112 generally maintains a constant or substantially constant thickness regardless of the region where the conformal film 112 is deposited. In one embodiment, the conformal film 112 may be deposited with greater than about 70% conformity, greater than about 80% conformity, greater than about 90% conformity, greater than about 95% conformity or greater than about 98% conformity. For example, a thickness 114 of the conformal film 112 may be maintained adjacent the top surface 108, the sidewalls 106, and the bottom surface 110 such that the thickness is predominantly equal across about 70% of the conformal film 112. In one embodiment, the thickness 114 may be between about 10 nm and about 100 nm, depending on the 3D structure dimensions and desired doping characteristics.

The conformal film 112 may be deposited by various deposition techniques, such as chemical vapor deposition (CVD) or plasma based deposition techniques. In one embodiment, the conformal film 112 may be deposited by a thermal CVD technique. In this embodiment, a thermal precursor vaporization apparatus may be coupled to a suitably configured film deposition chamber to prepare various precursors prior to deposition. Temperatures utilized by the thermal precursor vaporization apparatus may be between about 70° C. and about 150° C., depending on the precursor utilized. In another embodiment, the conformal film 112 may be deposited by a plasma enhanced chemical vapor deposition (PECVD) deposition technique. In this embodiment, the plasma may be generated by a remote plasma source or may be generated inside a processing chamber. In another embodiment, the conformal film 112 may be deposited by a hybrid thermal/plasma deposition technique. A suitable apparatus for depositing the conformal film 112 is the PRODUCER® chamber, available from Applied Materials, Inc., Santa Clara, Calif. It is contemplated that suitably configured chambers from other manufacturers may also be utilized to perform the conformal film deposition according to the embodiments described herein.

Figure 2:
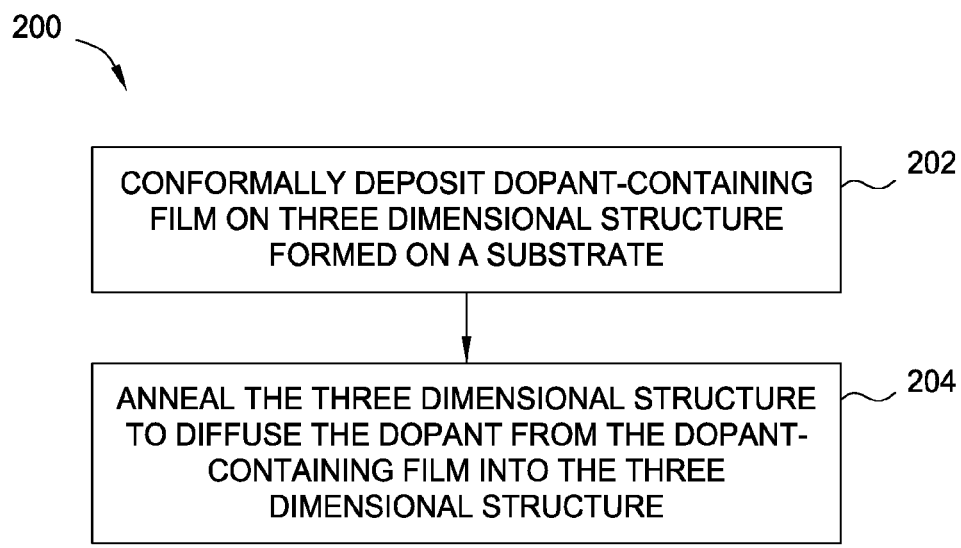
FIG. 2 illustrates operations of a method for performing a conformal film deposition and doping process according to embodiments described herein.

FIG. 2 illustrates operations of a method 200 for performing a conformal film deposition and doping process according to embodiments described herein. At operation 202, a conformal dopant containing film may be deposited on 3D structures formed on a substrate. The film may be deposited utilizing suitable processing conditions configured to provide for conformity as described above. In one embodiment, the dopant containing conformal film may be deposited on a substrate which is positioned in a processing region of a film deposition chamber. The dopant containing conformal film may include dopants and non-dopant materials in certain embodiments. Suitable dopants species include boron, phosphorous, arsenic, antimony, aluminum, and gallium, among others. Non-dopant materials include carbon, nitrogen, silicon, and oxygen, among others. Generally, the dopants in the conformal film will be diffused into the 3D structures during subsequent processing operations while the non-dopant materials will not diffuse into the 3D structures.

In one example, a boron-carbon-nitrogen film may be deposited on the 3D structures. In this embodiment, a boron containing precursor, such as dimethylamine borane, may be exposed to the 3D structures in the film deposition chamber. Optionally, the boron containing precursor may be heated prior to entry into the processing region of the film deposition chamber. In this embodiment, the non-dopant materials carbon and nitrogen may also be exposed to the 3D features. A suitable carbon containing precursor may be a hydrocarbon containing material, such as propene, and a suitable nitrogen containing precursor may be ammonia or the like.

To control the elemental composition of the conformal film, the flow rates of the precursors may be varied to influence the conformal film compositional profile. In addition, various carrier gases, such as argon, nitrogen, hydrogen, and helium, among others, may be provided to the processing volume of the film deposition chamber along with the precursors. One or more carrier gases may be provided to the film deposition chamber at a rate of between about 100 sccm to about 20,000 sccm. A partial pressure of the dopant precursor relative to the carrier gas may be between about 10 Pascal to about 1000 Pascal.

A temperature of the film deposition chamber may be maintained between about 200° C. and about 650° C. during the conformal film deposition process. A pressure of the film deposition chamber may be maintained between about 100 mTorr and about 100 Torr during the conformal film deposition process. It is believed that precursor flow rates, chamber temperatures, and chamber pressures may be configured to influence the conformity of the dopant containing film to provide a degree of conformity suitable for subsequent doping of the 3D structures.

At operation 204, the 3D structures may be annealed to diffuse the dopant form the dopant containing conformal film into the 3D structures. The substrate may be transferred from the film deposition chamber to an annealing chamber, such as a rapid thermal processing chamber. Rapid thermal processing may utilize various electromagnetic energy sources to anneal the substrate. For example, radiant heating, laser annealing, or combinations thereof may be utilized to drive the dopants from the conformal film into the 3D structures. In one embodiment, suitable apparatus for performing the annealing process include the VANTAGE® ASTRA™ tool, VANTAGE® RADIANCE® PLUS tool, VANTAGE® VULCAN™ tool, all available from Applied Materials, Inc., Santa Clara, Calif. It is contemplated that suitably configured annealing apparatus from other manufacturers may also be used to perform the annealing process described herein.

The annealing process may be performed at a temperature of between about 700° C. and about 1100° C., such as between about 850° C. and about 1050° C. The annealing process is generally configured to quickly heat the materials disposed on the substrate in a repetitive manner. Temperature cycling may be performed on the millisecond scale to second scale and it is believed that the annealing not only causes the dopant to diffuse from the conformal film in to the 3D structures, but may also volatilize non-dopant materials of the conformal film to prevent diffusion of the non-dopant materials into the 3D structures.

As a result of the conformity of the conformal dopant containing film, dopant diffusion into the 3D structures may progress in a controlled manner such that dopant distribution within the 3D structures is predominantly uniform. In other words, the dopant diffuses into the 3D structures from multiple directions (i.e. sidewalls and top surfaces) and the depth of diffusion may be controlled by the annealing process. In the boron-carbon-nitrogen embodiment described above, the boron concentration in the 3D structures (post anneal) may be between about $2.5 \times 10^{21}$ atoms/$cm^3$ and about $3.5 \times 10^{21}$ atoms/$cm^3$. The carbon and nitrogen concentration in the 3D structures (during post anneal) may be less than about $5.0 \times 10^{18}$ atoms/$cm^3$, such as less than about $5.0 \times 10^{17}$ atoms/$cm^3$. Depending on the depth of diffusion as a result of the annealing process, the concentration of carbon and nitrogen may be about 0 atoms/$cm^3$ or another negligible concentration which does not significantly affect device functionality (i.e. threshold voltage) of the 3D structures. By selectively incorporating the dopant into the 3D structures in a uniform manner, the dopant distribution in the 3D structures may provide for improved threshold voltage engineering and may also provide for improved device performance.

After the annealing process has been performed, any remaining portions of the dopant depleted conformal film may be removed from the substrate and the 3D structures. Various etching processes, such as wet etching or dry plasma etching processes, having chemistries selected to preferentially remove the conformal film may be utilized to remove the conformal film. As a result, the 3D structures may be doped with desirable dopant species and the 3D structures may be suitable for subsequent device structure fabrication processes.

The invention claimed is:

1. A substrate processing method, comprising:
 depositing a conformal film consisting of boron, carbon, and nitrogen by a combination of a thermal chemical vapor deposition process and a plasma deposition process on a three dimensional structure formed on a substrate, wherein the three dimensional structure is a silicon containing FinFET device; and
 annealing the three dimensional structure and the film to diffuse the boron into the three dimensional structure to dope the FinFET device.

2. The method of claim 1, wherein the boron in the film is derived from a dimethylamine borane precursor.

3. The method of claim 1, wherein the annealing process is a rapid thermal annealing process.

4. The method of claim 3, wherein the rapid thermal annealing process is a spike annealing process performed at a temperature of between about 700° C. and about 1100° C.

5. The method of claim 4, wherein the spike annealing process comprises a laser spike anneal.

6. A substrate processing method, comprising:
 forming silicon containing three dimensional structures on a substrate;
 exposing the silicon containing three dimensional structures to one or more dopant containing precursors and one or more carrier gases;
 depositing a conformal film consisting of boron, carbon, and nitrogen by a combination of a thermal chemical vapor deposition process and a plasma deposition process on the silicon containing three dimensional structures;
 annealing the silicon containing three dimensional structures and the conformal film to diffuse the dopant from the conformal film into the silicon containing three dimensional structures.

7. The method of claim 6, wherein the silicon containing three dimensional structures comprise a FinFET device structure.

8. The method of claim 6, wherein the dopant is boron and the dopant containing precursor is dimethylamine borane.

9. The method of claim 6, wherein the annealing is a spike annealing process performed at temperatures of between about 700° C. and about 1100° C.

10. A substrate processing method, comprising:
 positioning a substrate having three dimensional structures formed thereon in a processing region of a film deposition chamber;
 exposing the three dimensional structures to one or more dopant containing precursors and one or more carrier gases;
 depositing a conformal film consisting of boron, carbon, and nitrogen by a combination of a thermal chemical vapor deposition process and a plasma deposition process on the three dimensional structures;
 transferring the substrate to a thermal processing chamber; and
 annealing the three dimensional structures and the conformal film to diffuse the dopant from the conformal film into the three dimensional structures.

11. The method of claim 10, further comprising:
 removing the conformal film from the three dimensional structures after performing the annealing.

12. The method of claim 10, wherein the film deposition chamber is configured to perform a thermal chemical vapor deposition process to deposit the conformal film.

13. The method of claim 12, wherein the depositing the conformal film is performed in the film deposition chamber at a temperature of between about 200° C. and about 650° C.

14. The method of claim 13, wherein the processing region is maintained at a pressure of between about 100 mTorr and about 100 Torr during the conformal film deposition.

15. The method of claim 10, wherein the annealing is a spike annealing process performed at temperatures of between about 700° C. and about 1100° C.

16. The method of claim 10, wherein the one or more dopant containing precursors comprise dimethylamine borane.

17. The method of claim 16, wherein a partial pressure of the dimethylamine borane in the one or more dopant containing precursors and the one or more carrier gases is between about 10 Pascal and about 1000 Pascal.

* * * * *